(12) United States Patent
Inagawa

(10) Patent No.: US 7,652,227 B2
(45) Date of Patent: Jan. 26, 2010

(54) HEATING AND COOLING PLATE FOR A VACUUM CHAMBER

(75) Inventor: Makoto Inagawa, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 682 days.

(21) Appl. No.: 11/419,185

(22) Filed: May 18, 2006

(65) Prior Publication Data

US 2007/0267144 A1    Nov. 22, 2007

(51) Int. Cl.
- H05B 3/68 (2006.01)
- F27B 5/06 (2006.01)
- F27B 5/14 (2006.01)
- F27D 9/00 (2006.01)
- C23C 16/00 (2006.01)
- F28D 7/10 (2006.01)
- F25B 29/00 (2006.01)

(52) U.S. Cl. ............ 219/390; 219/444.1; 165/61; 165/104.19; 165/154

(58) Field of Classification Search .......... None
See application file for complete search history.

(56) References Cited

U.S. PATENT DOCUMENTS

| | | | | |
|---|---|---|---|---|
| 5,397,396 A | * | 3/1995 | Kosky et al. ........... | 118/724 |
| 5,484,011 A | * | 1/1996 | Tepman et al. ........... | 165/80.2 |
| 5,595,241 A | * | 1/1997 | Jelinek ........... | 165/80.1 |
| 5,775,416 A | * | 7/1998 | Heimanson et al. ........... | 165/275 |
| 5,796,074 A | * | 8/1998 | Edelstein et al. ........... | 219/390 |
| 6,376,806 B2 | | 4/2002 | Yoo | |
| 7,115,838 B2 | * | 10/2006 | Kurara et al. ........... | 219/444.1 |
| 7,126,087 B2 | * | 10/2006 | Kamata et al. ........... | 219/399 |
| 2002/0011478 A1 | * | 1/2002 | Ratliff et al. ........... | 219/390 |
| 2004/0244945 A1 | * | 12/2004 | Lee et al. ........... | 165/47 |
| 2006/0231027 A1 | * | 10/2006 | Iwabuchi ........... | 118/719 |

* cited by examiner

Primary Examiner—Joseph M Pelham
(74) Attorney, Agent, or Firm—Patterson & Sheridan, LLP

(57) ABSTRACT

A thin plate thermally coupled to a cooling tube is positioned between a heating plate and a substrate and is adapted to serve as a heating plate or a cooling plate for the substrate. The thin plate and heating plate may be positioned in a load lock for the expeditious heating and cooling of large-area substrates. The cooling tube may include a first conduit, a second conduit disposed inside the first conduit having substantially no contact with the first conduit and containing a working fluid, and an isolation region disposed between the first conduit and the second conduit. The working fluid may be thermally decoupled from the thin plate by evacuating the isolation region and thermally coupled to the thin plate by filling the isolation region with a heat-conducting gas.

20 Claims, 11 Drawing Sheets

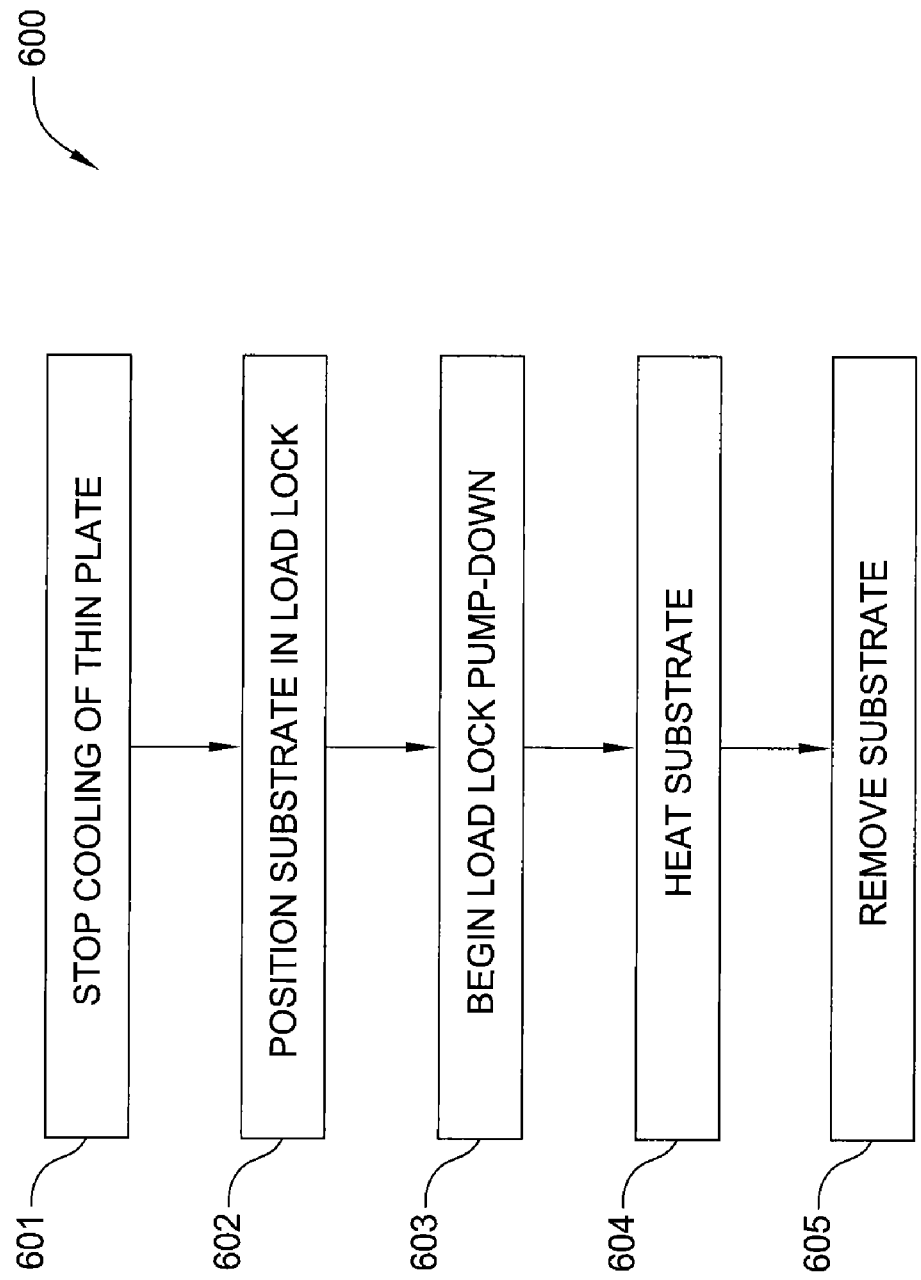

HEATING AND COOLING PLATE FOR A VACUUM CHAMBER

BACKGROUND OF THE INVENTION

1. Field of the Invention

Embodiments of the present invention generally relate to the processing of substrates for the manufacture of electronic devices thereon. More particularly, this invention relates to a process and apparatus for heating and cooling a substrate in a vacuum chamber.

2. Description of the Related Art

The manufacture of integrated circuits or flat panel displays generally entails performing numerous processes on a substrate in a vacuum chamber, e.g., physical vapor deposition (PVD), chemical vapor deposition (CVD), etch, etc. Prior to processing a substrate in a vacuum chamber, it is often desirable to heat the substrate. Heating of a substrate prior to processing is generally performed in order to remove residual gases adsorbed on the surface of the substrate, particularly water vapor. In addition to a relatively large quantity of water vapor molecules, which deleteriously affect high vacuum levels, adsorbed gases may also include contaminants undesirable for a particular vacuum process, i.e., the adsorbates present on the substrate during some processes may adversely affect the film formed thereon.

Therefore, prior to processing in a high-vacuum chamber, adsorbates are typically removed from the walls of the chamber via a chamber bake-out and from substrates via a heating or "degassing" process. Otherwise, each substrate brought into the high-vacuum chamber would bring relatively large quantities of moisture into the chamber, making the desired vacuum level for the chamber difficult or impossible to maintain. Further, the large quantities of water vapor brought into a high-vacuum processing chamber as adsorbates on substrates will prematurely load the cryogenic pumps, or "cryo pumps," that are typically used to achieve high and ultra-high vacuum conditions therein. Premature cryo pump loading results in more chamber down-time, because cryo pump regeneration is time-consuming. Any processing in the chamber is stopped, the cryo pump is isolated from the vacuum chamber, and the frozen gases adsorbed thereon are removed by a purge gas, typically heated nitrogen. Because the time to complete the regeneration process is so long, i.e., on the order of several hours, it is important to perform the cryo pump regeneration as infrequently as possible for a high-vacuum processing chamber to have high throughput.

While a degassing process for incoming substrates is helpful for maintaining higher levels of vacuum in any vacuum chamber, for some processes it is more helpful than others. For example, PVD is performed in an ultra-high vacuum chamber, i.e., absolute pressure $\leq 10^{-7}$ Torr, using a magnetron sputtering process by placing a target above the substrate, providing a gas, such as argon, between the target and the substrate, and exciting the gas with a high-voltage DC signal to create ions that strike the target. As the target is bombarded by ions, target atoms are dislodged and become deposited onto the substrate. The dislodged target atoms generally have substantial kinetic energy and when they impact the substrate the atoms tend to strongly adhere to the substrate. Because it is important to the PVD process to maintain high vacuum levels, degassing is generally performed on substrates prior to any PVD processing.

Degassing of a substrate is typically performed by heating the substrate after it has been placed under vacuum but prior to entry into the processing chamber. For smaller substrates, such as 200 and 300 mm diameter silicon wafers, one or more dedicated vacuum chambers are generally provided on a substrate processing platform in which degassing of the substrate may take place prior to other processing, such as PVD or CVD. After degassing, the substrate is then transferred to the next processing chamber without exposure to air. For large-area substrates, such as glass substrates used for flat panel displays that are 1 m×1 m and larger, utilizing additional processing chambers for degassing is generally undesirable due to the added size, i.e., footprint, and expense of a substrate processing system that would result thereby. The term "large-area substrates," as used herein, refers to substrates which are about 1 m×1 m and larger. Because the large size and shape of large-area glass substrates makes transfers thereof from one position in the processing system to another relatively difficult and time-consuming, substrate transfers are preferably minimized when processing such large-area substrates. A dedicated degas chamber requires additional substrate transfers compared to a combined load lock/degas chamber.

FIG. 1 is a schematic view of a large-area substrate processing platform, system 100. System 100 includes a vacuum load lock assembly 101, a central transfer chamber 102, a substrate transfer robot 104, and one or more vacuum processing chambers 103. Vacuum load lock assembly 101 and the one or more vacuum processing chambers 103 are generally positioned adjacent and in fluid communication with the transfer chamber 102. Vacuum load lock assembly 101 may contain two or more single slot load locks, load locks 101A-C, which may be stacked vertically due to the size of substrate processed by system 100. Load locks 101A-C and the one or more vacuum processing chambers 103 may be fluidly coupled and decoupled from the central transfer chamber 102 by a slit valve, a gate valve, or other vacuum tight sealing mechanism. The load locks 101A-C act as a transition chamber between atmospheric pressure and the process pressure, which may be several orders of magnitude higher vacuum than that achievable by load locks 101A-C. Transfer chamber 102 is typically maintained at a medium or high vacuum level, e.g., on the order of about $10^{-6}$ Torr, and acts as a further transition chamber between the low vacuum present in load locks 101A-C, e.g. $10^{-3}$ Torr, and the high or ultra-high vacuum present in vacuum processing chambers 103, e.g., $10^{-9}$ Torr.

In operation, each of load locks 101A-C is adapted to accept a substrate, isolate the substrate from atmosphere and from transfer chamber 102, pump down to medium or high vacuum, e.g., $10^{-3}$ Torr, and heat the substrate to a degassing temperature, for example about 100° C. Each of load locks 101A-C is further adapted to fluidly couple itself to the transfer chamber 102 after degassing, allowing transfer of the degassed substrate to transfer chamber 102 for subsequent processing in one or more of the vacuum processing chambers 103. After processing in one or more of vacuum processing chambers 103, substrates need to be cooled and removed from system 100. For substrates that are not as large as 1 m×1 m, for example 550 mm×650 mm, a second "exit only" load lock assembly has been used for substrate cooling and venting to atmosphere, allowing adequate cooling of a substrate without substantially affecting throughput of the system. Configuring a large-area substrate processing platform with a second load lock becomes increasingly problematic, however, due to cost and platform footprint constraints. Therefore, it is desirable for load locks 101A-C to be adapted for cooling and venting large-area substrates for removal from system 100 as well as for heating and pumping down large-area substrates for processing in system 100.

Efficient production line processing requires rapid movement of the substrates from one chamber to another within a processing system as well as between vacuum environments and atmospheric environments. Hence, the cooling process cannot take too long, otherwise system throughput will suffer-especially if incoming substrates are degassed in the same chamber in which processed substrates are cooled.

FIG. 2 illustrates a partial schematic side view of a substrate S positioned in a load lock 500 above a heating plate 521, wherein load lock 500 serves as a load lock for a large-area substrate processing system, such as system 100, described above in conjunction with FIG. 1. Heating plate 521 is typically constructed of steel or aluminum, contains one or more resistive heating elements, and is designed to act as an evenly distributed radiant heat source for the substrate degassing process. To minimize heating non-uniformity due to edge effect, heating plate 521 typically extends a distance 560 beyond the periphery of substrate S and is separated by a small gap 561 from substrate S, wherein distance 560 is relatively large compared to small gap 561.

During the heating/degassing process, heating plate 521 is adapted to maintain an elevated and substantially constant temperature, e.g., 200° C., in order to heat the entire substrate to approximately 100° C. via radiant heat transfer. The substrate S is preferably heated concurrently with pump-down of load lock 500 to increase throughput. Because the majority of the degassing process takes place under vacuum, virtually all substrate heating takes place via radiative heat transfer 550 from heating plate 521. The degassing process generally takes place relatively quickly, only lasting between about 40 seconds and 60 seconds, and therefore is not throughput limiting for a large substrate processing system, such as system 100. During substrate cooling, however, throughput is deleteriously affected by radiative heat transfer 550 from the heating plate 521. The substantial thermal inertia associated with a heating plate as large as heating plate 521, combined with its presence in a vacuum chamber, significantly retards the rate at which heating plate 521 can cool after the heating elements of the heating plate have been turned off. Although a cooling gas 510 is typically flowed into load lock 500 during the substrate cooling process and the heating elements of heating plate 521 are turned off, substrate S is typically still absorbing heat from heating plate 521 at the same time that it is being cooled, and this substantially slows the cooling process.

Therefore, there is a need for an apparatus and method for efficiently heating and cooling a substrate in a vacuum chamber.

SUMMARY OF THE INVENTION

Embodiments of the present invention provide an apparatus used for thermally coupling and decoupling a working fluid from a heat transfer surface. In one embodiment, the apparatus comprises a first conduit thermally coupled to a heat transfer surface and a second conduit disposed inside the first conduit, wherein the second conduit contains a working fluid. The first and second conduits are adapted so that there is substantially no contact therebetween to minimize unwanted heat transfer. The apparatus further comprises an isolation region disposed between the first conduit and the second conduit, a vacuum source adapted to be fluidly coupled to the isolation region, and a gas source adapted to be fluidly coupled to the isolation region. The heat transfer surface may be a cooling plate brazed to the first conduit and the gas source may be a helium gas source. The second conduit may be spaced apart from the first conduit by a wire suspension inside the first conduit.

In another embodiment an apparatus for heating and cooling a substrate in a vacuum chamber comprises a heating plate adapted to maintain a substantially constant temperature, a thin plate disposed proximate and substantially parallel to the heating plate, and a cooling tube thermally coupled to the thin plate. The cooling tube comprises a first conduit, a second conduit that is disposed inside the first conduit having substantially no contact with the first conduit and containing a working fluid, and an isolation region disposed between the first conduit and the second conduit. The apparatus further comprises a vacuum source adapted to be fluidly coupled to the isolation region, a gas source adapted to be fluidly coupled to the isolation region, and a substrate support adapted to support a substrate proximate and substantially parallel to the thin plate, wherein the thin plate is disposed between the heating plate and the substrate. The thin plate may be brazed to the first conduit and the gas source may be a helium gas source.

In another embodiment, a vacuum load lock is adapted to heat and cool a substrate and comprises a chamber body defining a substrate processing region and a heating plate disposed in the substrate processing region and adapted to maintain a substantially constant temperature. The apparatus further comprises a thin plate, a cooling tube, a first conduit, a second conduit, an isolation region, a vacuum source, a gas source, and a substrate support, all of which are organized as described above in the previous embodiment. The second conduit may be spaced from the first conduit by a wire suspension inside the first conduit. The thin plate may be brazed to the first conduit, the gas source may be a helium gas source, and the working fluid may be chilled water.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 6 is a flow chart summarizing a process sequence for degassing a substrate in a load lock.

For clarity, identical reference numerals have been used, where applicable, to designate identical elements that are common between figures.

DETAILED DESCRIPTION

Aspects of the invention contemplate methods and apparatus that allow a substrate to be alternately heated and cooled in a vacuum chamber without adversely affecting throughput. More particularly, aspects of the invention relate to the heating and cooling of a large-area glass substrate in a vacuum load lock by positioning a thin plate between a heating plate and a substrate, wherein the thin plate is thermally coupled to a cooling tube.

Figure 3:
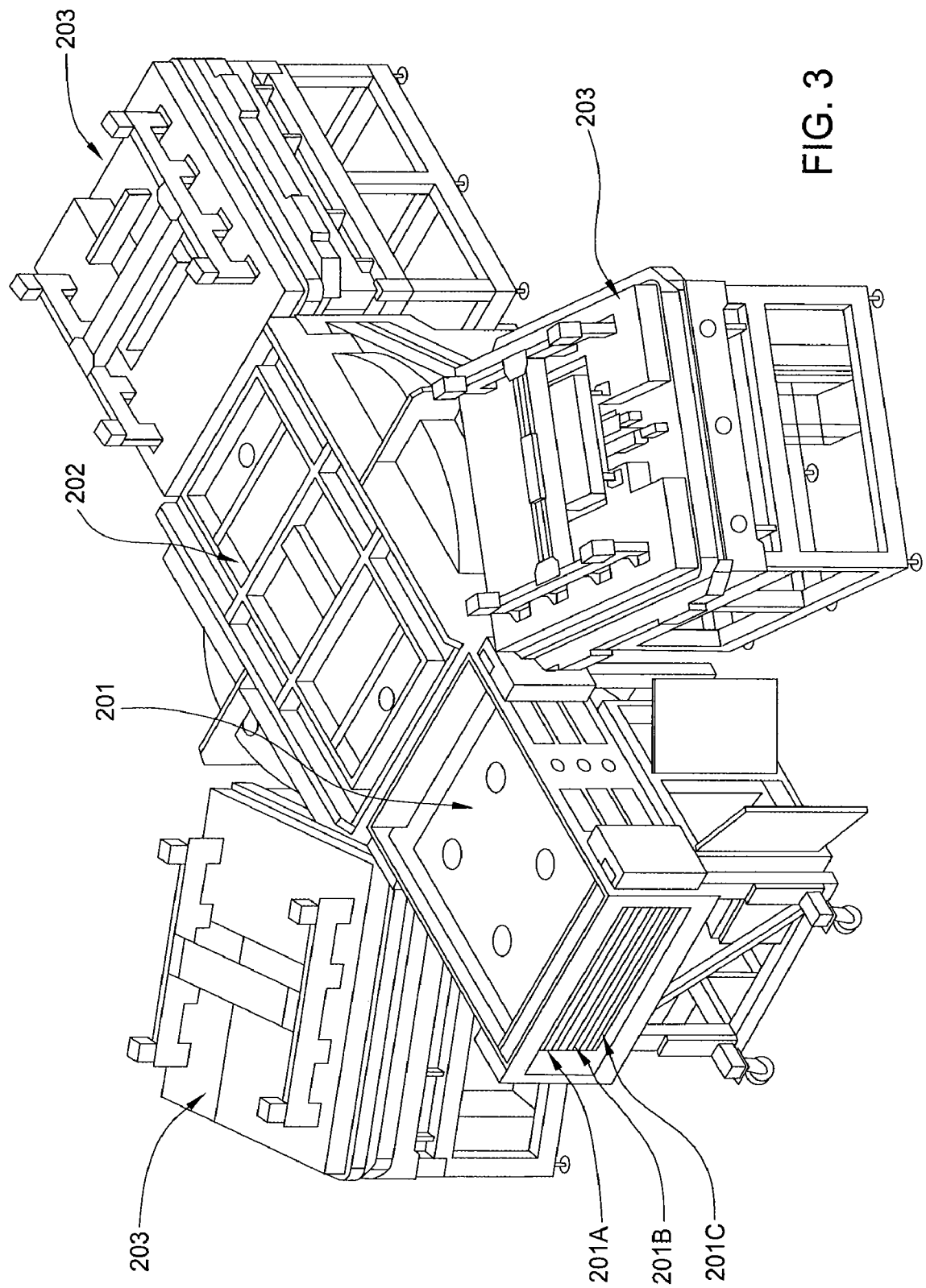
FIG. 3 is a perspective view of a substrate processing platform that may benefit from embodiments of the invention.

FIG. 3 is a perspective view of a substrate processing platform, system 200, that may benefit from embodiments of the invention. System 200 generally includes a central transfer chamber 202 with a load lock assembly 201 and multiple vacuum processing chambers, chambers 203. Vacuum load lock assembly 201 and the one or more chambers 203 are generally positioned adjacent and in fluid communication with the transfer chamber 202. Vacuum load lock assembly 201 may contain two or more single slot load locks, load locks 201A-C, which are typically stacked vertically due to the size of substrate processed by system 200. Embodiments of the invention are most beneficial for system 200 when chambers 203 include one or more PVD chambers, due to the high level of vacuum required for PVD processing. However, other types of substrate processing chambers may also be contained in system 200 and benefit from the invention, such as CVD chambers.

Figure 4A:
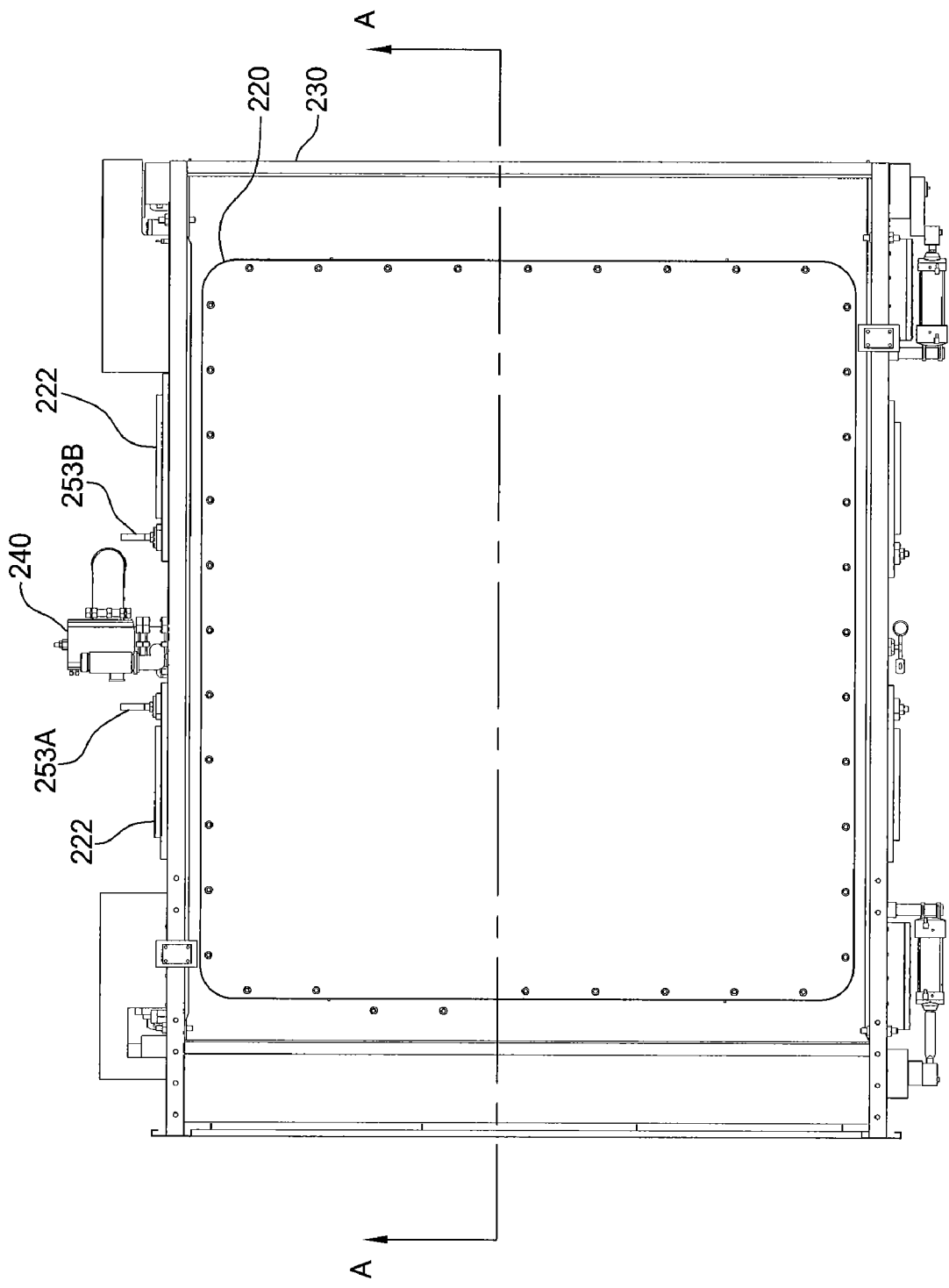
FIG. 4A is a plan view of a load lock assembly that includes embodiments of the invention.
Figure 4B:
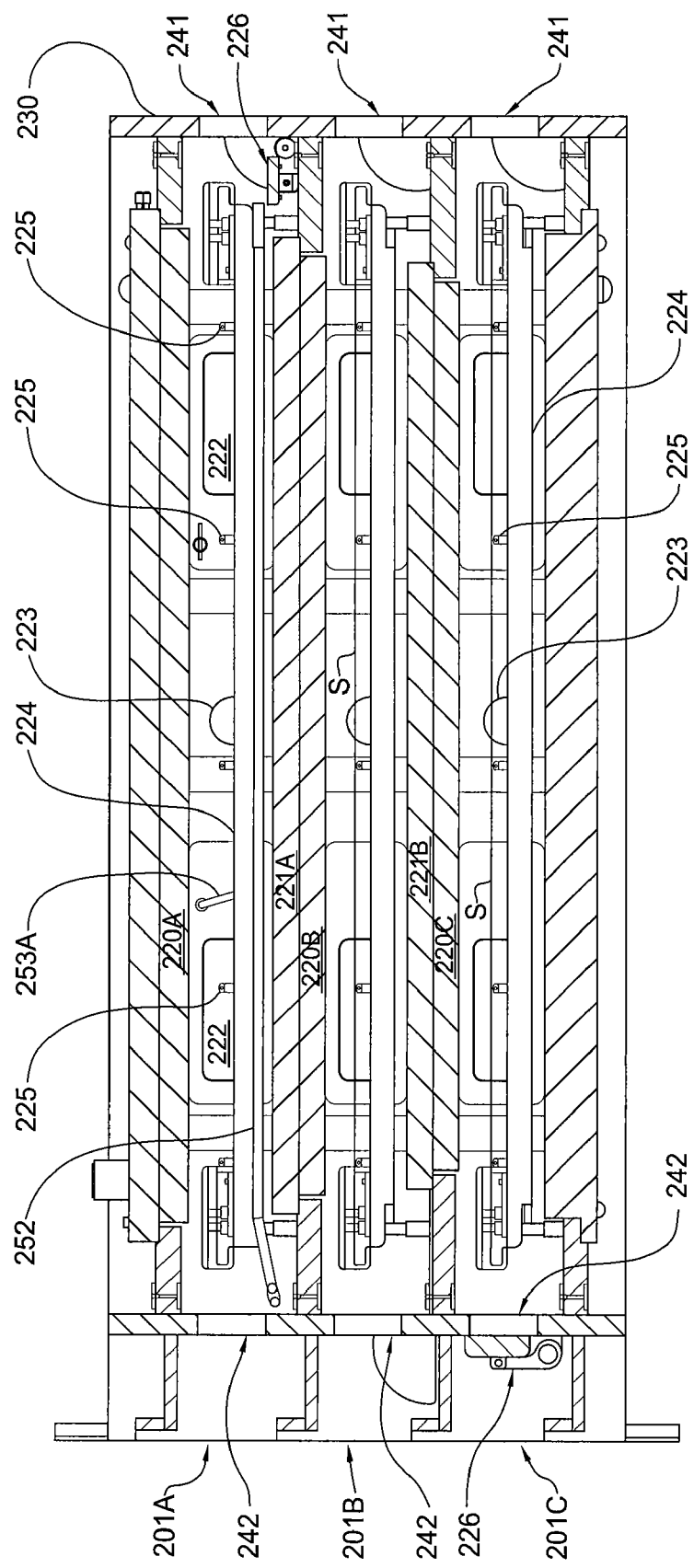
FIG. 4B is a sectional side view of a load lock assembly.
Figure 4C:
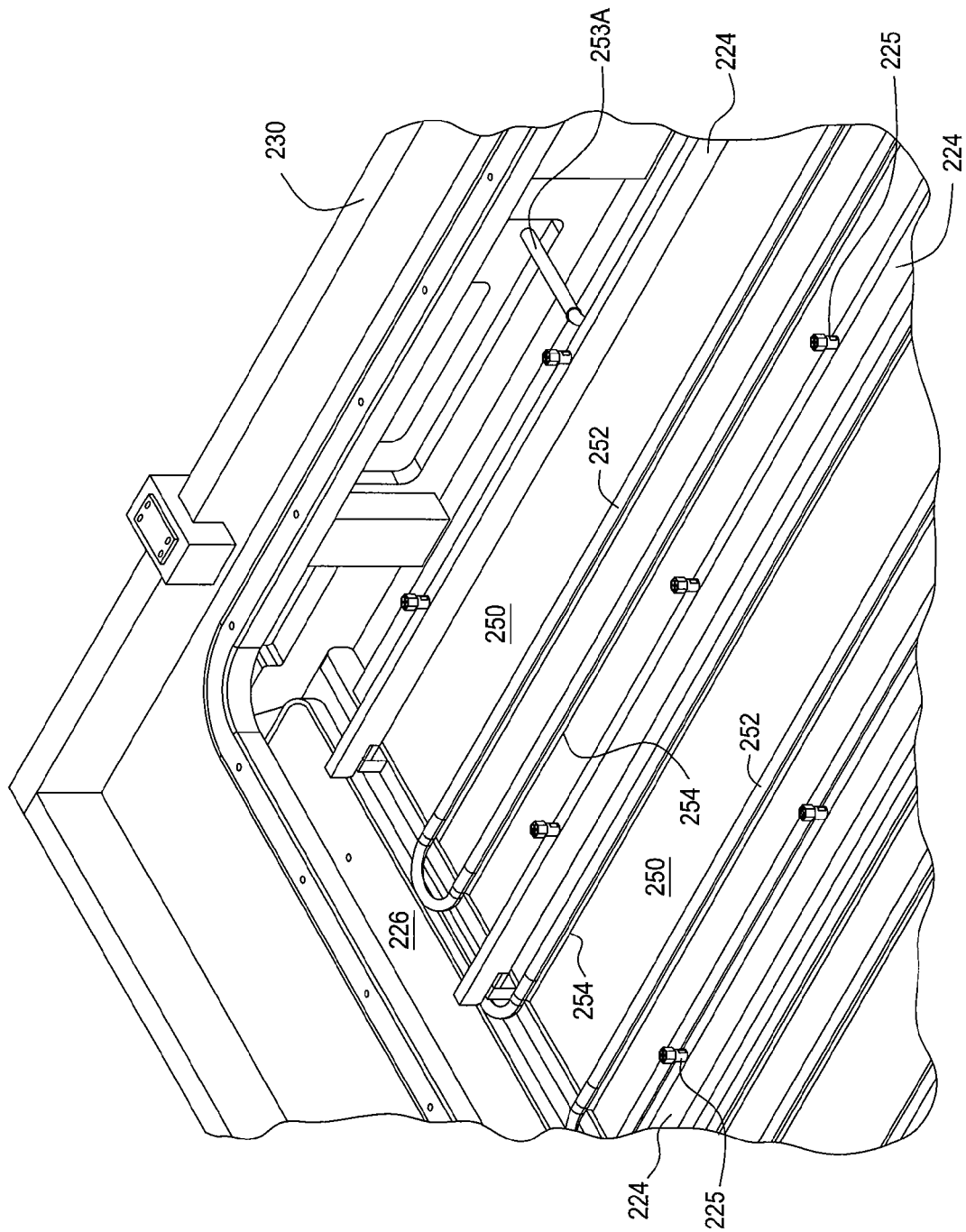
FIG. 4C is a partial perspective view of a load lock assembly containing one embodiment of the invention.

FIG. 4A is a plan view of load lock assembly 201 that includes embodiments of the invention and illustrates vertical section line A-A. FIG. 4B is a sectional side view of load lock assembly 201, the section being taken at vertical section line A-A from FIG. 4A. FIG. 4C is a partial perspective view of load lock assembly 201 with upper lid assembly 220 and lid 220A removed, revealing the interior of load lock 201A containing one embodiment of the invention.

Referring to FIGS. 4A-4C, load lock assembly 201 includes a vacuum pump 240 and load locks 201A-C. For purposes of illustration, load lock 201A is configured with one embodiment of the invention while load locks 201B, 201C are not. In practice, all three load locks 201A-C in load lock assembly 201 are preferably configured with the heating/cooling apparatus of the invention to maximize the throughput benefit of the invention. Regarding substrate handling, slit valves, and substrate supports, load locks 201B and 201C are substantially identical in operation and organization to load lock 201A. For illustrative purposes, a substrate S, is shown in load locks 201B, C.

Load lock 201A includes a chamber body 230 that forms the walls of load lock A, a lid 220A that forms the ceiling of load lock 201A, and a heating plate 221A that forms the floor of load lock 201A. View windows 222, a vacuum port 223, and substrate access ports 241, 242 are disposed in chamber body 230. Load lock 201A is configured with a plurality of substrate support beams 224, with support pins 225 disposed thereon (shown most clearly in FIG. 4C), to adequately support a large-area glass substrate to prevent sagging of the substrate without interfering in the radiative heat transfer between heating plate 221A and the substrate. Substrate support beams 224 are further adapted to allow support of a substrate in load lock 201A with minimal conductive heat transfer from heating plate 221A when cooling a substrate after processing in system 200. In the configuration illustrated in FIGS. 4B and 4C, substrate support beams 224 are not in contact with heating plate 221A. In another configuration, support pins 225 are attached directly to heating plate 221A, but are formed of an insulative material, such as a ceramic, to minimize conductive heat transfer from heating plate 221A.

Lids 220A-C may be water-cooled to minimize thermal impact of the heating process on adjacent load locks. For example, when lid 220B of load lock 201B is a water-cooled lid, load lock 201B is thermally isolated from load lock 201A, This prevents a significant amount of heat from being conducted from the heating plate 221A into load lock 201B, speeding the cooling process therein. Similarly, water-cooling in lid 220C thermally isolates load lock 201C from heating plate 221B.

Substrate access ports 241, 242 in each load locks 201A-C are configured to facilitate the entry and egress of large-area substrates. Substrate access port 241 for each load lock may be adapted to couple each load lock with an atmospheric substrate handling apparatus, such as a factory interface (not shown). Substrate access ports 242 for each load lock may be configured to couple each load lock with transfer chamber 202. In the configuration shown in FIG. 4B, substrate access ports 241, 242 are disposed on opposite ends of each load lock 201A-C, however other configurations of substrate access ports 241, 242 do not affect the beneficial use of the inventive apparatus. Substrate access ports 241, 242 are selectively sealed by a vacuum-tight slit valve 226. Slit valves 226 are adapted to selectively isolate a load lock from either transfer chamber 202 or from atmospheric conditions. Slit valves 226 are moved between an open and closed position by an actuator (not shown for clarity), which is typically a pneumatic actuator. In the configuration depicted in FIG. 4B, each of the slit valves 226 is pivotally coupled to the chamber body 230 along a first edge and rotated between the open and closed position by the actuator. For clarity, all the slit valves 226 are not shown in FIG. 4B. The slit valve 226 for the substrate access port 241 of load lock 201A is illustrated in the open position, allowing transfer of a substrate through substrate access port 241. The slit valve 226 for substrate access port 242 of load lock 201C is illustrated in the closed position, isolating load lock 201C from transfer chamber 202.

A more detailed description of a load lock assembly that may benefit from aspects of the invention may be found in commonly assigned U.S. patent application Ser. No. 10/832, 795, entitled "Load Lock Chamber for Large Area Substrate Processing System," filed on Apr. 26, 2004, which is hereby incorporated by reference in its entirety to the extent not inconsistent with the claimed invention.

Heating plate 221A is preferably a heating plate configured with an internal heating element, such as a resistive heating element, and is adapted to heat a substrate by radiative heat transfer. Another method of heating a large-area substrate is via high-power radiant lamps, but this approach is less advantageous than the inventive apparatus when the high material cost, increased operating cost, and reduced reliability are considered. For degassing a 2 m×2 m substrate, for example, the material cost for an appropriately sized lamp array is estimated to be on the order of five times the cost of a radiant heating plate. In addition, significantly more power is required compared to a heating plate. Further, the reliability of an array of high power lamps is substantially less than that of a heating plate due to the large number of components contained in the array compounded by the generally shorter mean time between failure of such a lamp compared to a resistive heating element.

Rather than heating a substrate directly, aspects of the invention contemplate heating a thin plate 250 that is disposed between heating plate 221A and a substrate resting on support pins 225. Thin plate 250 is heated by heating plate 221A, which in turn radiatively heats and degasses a substrate in load lock 201A. When a substrate is cooled in load lock 201A, thin plate 250 is adapted to serve as a cooling plate under the substrate, minimizing heat transfer from heating plate 221A to the substrate and speeding the process of cooling a substrate.

Figure 5A:
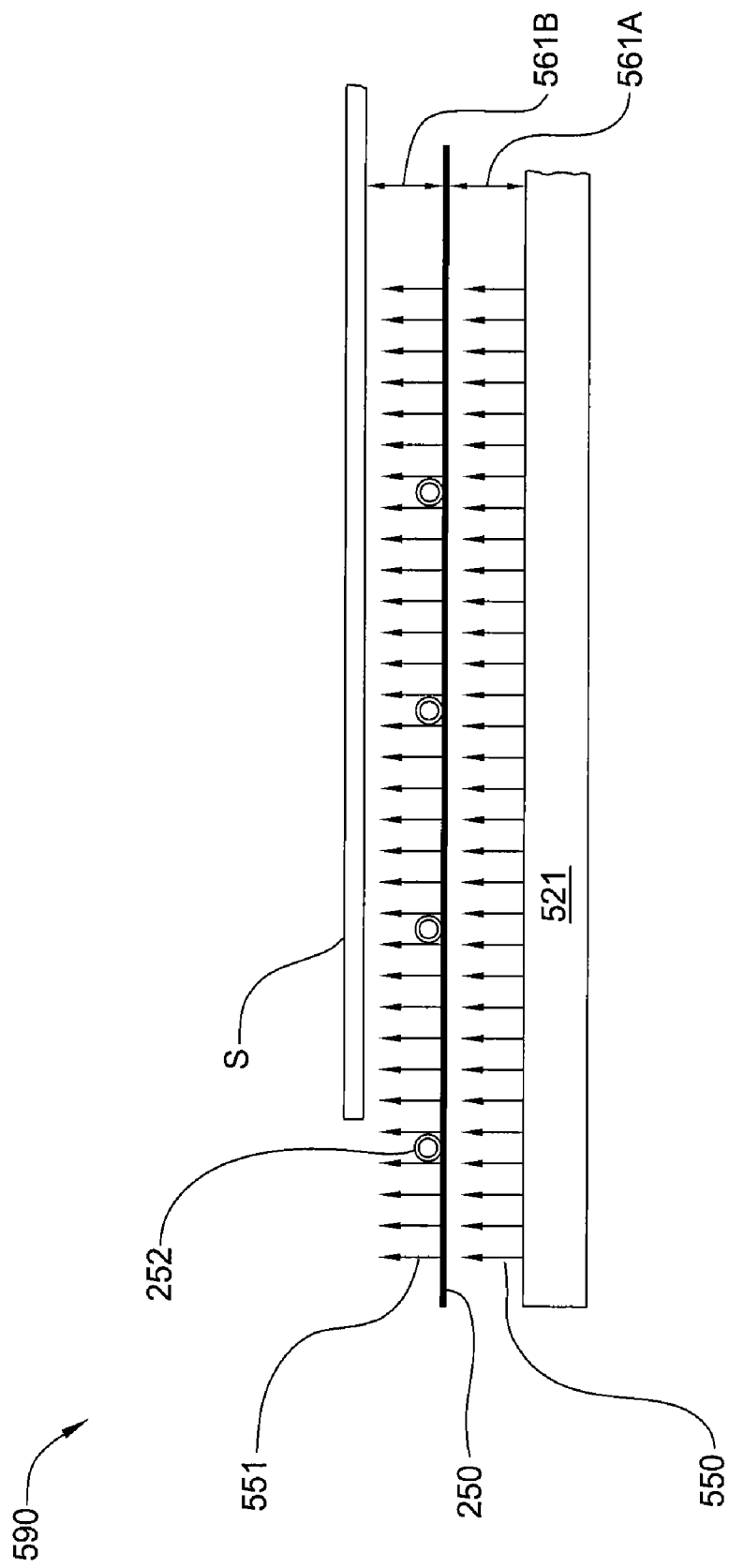
FIG. 5A illustrates a partial schematic side view of a substrate positioned above a thin plate and a heating plate in a load lock.

FIG. 5A illustrates a partial schematic side view of a substrate S positioned above a thin plate 250 and a heating plate 521 in a load lock 590, wherein load lock 590 serves as a load lock for a large-area substrate processing system, such as system 200, described above in conjunction with FIG. 3. Substrate S may be positioned on substrate supports, such as support pins 225 (not shown in FIG. 5A for clarity), described above in conjunction with FIGS. 4B and 4C. Thin plate 250 is disposed between substrate S and heating plate 521 and is adapted to prevent any direct radiative heat transfer between substrate S and heating plate 521, i.e., there is no unobstructed light path therebetween.

Figure 1:
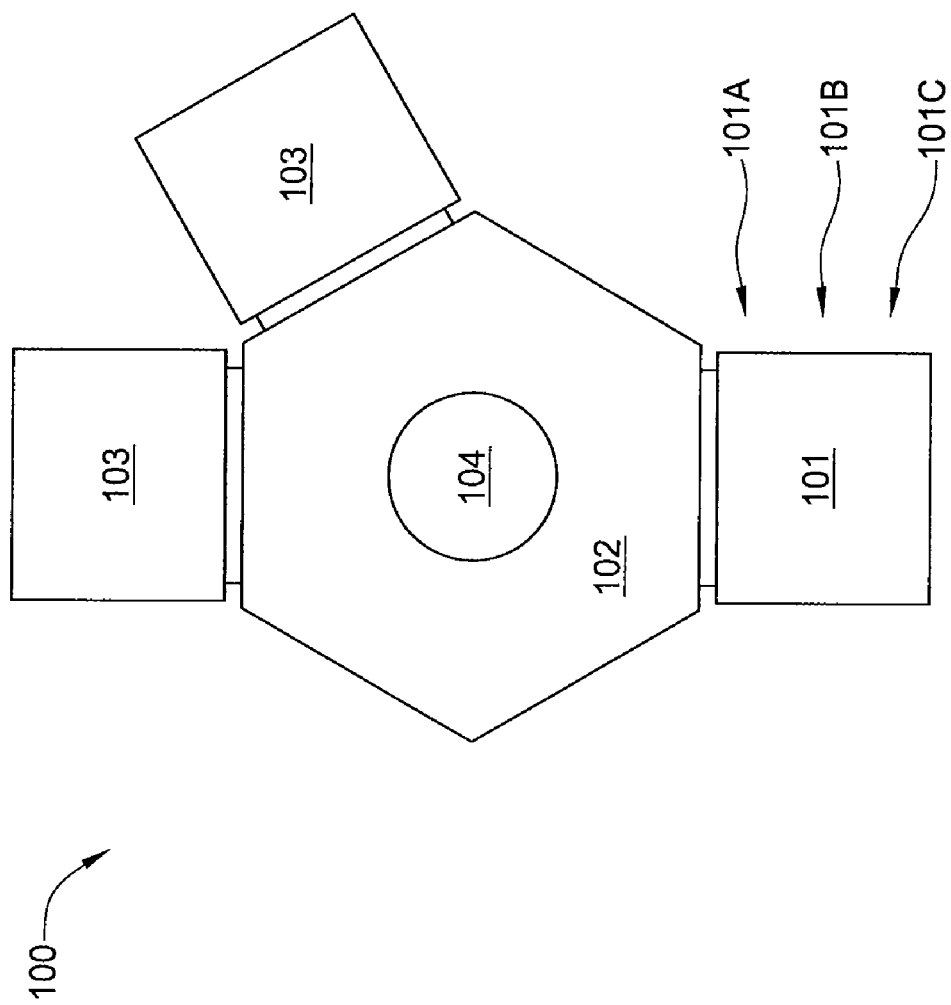
FIG. 1 (Prior Art) is a schematic plan view of a large-area substrate processing platform.
Figure 2:
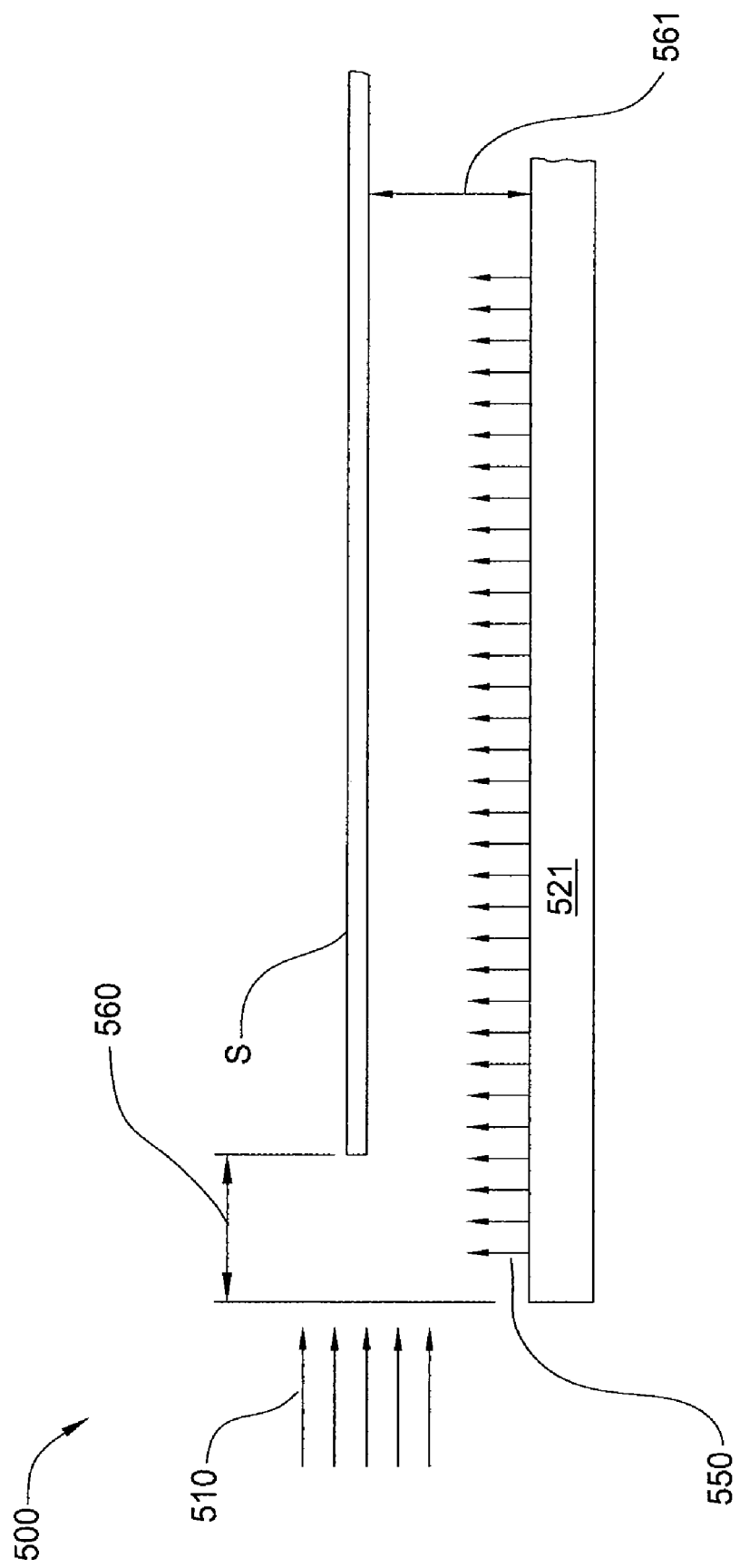
FIG. 2 (Prior Art) illustrates a partial schematic side view of a substrate positioned in a load lock above a heating plate with no thin plate disposed therebetween.

Thin plate 250 is preferably constructed of as thin a material as practicable in order to minimize the thermal inertia thereof, for example on the order of about 0.10 inches or even less. It is also desirable that thin plate 250 is constructed of a material that has a high coefficient of thermal conductivity, such as aluminum. Another important feature of thin plate 250 is that the surface thereof that is oriented toward substrate S is highly emissive in the infrared bands so that when thin plate 250 is at an elevated temperature, i.e., during a degassing process, heat energy is efficiently emitted toward substrate S. A black anodized surface is preferred for this because it has a relatively high emissivity, i.e., approximately 0.82. A lower emissivity surface, such as a polished steel surface with an emissivity of approximately 0.066, would require thin plate 250 to be at a much higher temperature to emit the same heat energy toward substrate S, requiring more time and energy to complete the degassing process. Thin plate 250 may also be adapted to have no direct thermal contact with either heating plate 521 or substrate S. In a preferred embodiment, illustrated in FIG. 4C, thin plate 250 is mounted to the bottom of substrate support beams 224 and contacts neither heating plate 521 nor substrate S directly. Ideally, the spacing between substrate S and thin plate 250, i.e., spacing 561A, and the spacing between thin plate 250 and heating plate 521, i.e., spacing 561B, have a total spacing that is substantially the same as that of small gap 561, illustrated in FIG. 1A.

Thin plate 250 is further adapted to serve as a cooling plate during a substrate cooling process by being thermally coupled to a tube that contains a cooling fluid during the substrate cooling process. This tube is mounted proximate all regions of thin plate 250. A preferred configuration is depicted in FIG. 4C, wherein a tube 252 is mounted on and thermally coupled to thin plate 250 and enters and exits load lock 201A through feed-throughs 253A, 253B, respectively. In the preferred configuration, tube 252 is run stepwise across the surface of thin plate 250 from side to side, leaving no region of thin plate 250 thermally isolated therefrom. Preferably, tube 252 is mounted to thin plate 250 in such a way as to maximize conductive heat transfer therebetween, such as by welding or brazing. Because thin plate 250 is configured to be very thin, brazing is generally the most effective method of thermally coupling tube 252 thereto. Hence, when a cooling fluid is flowed through tube 252, thin plate 250 is quickly reduced in temperature, even when a heating plate, such as heating plate 521 in FIG. 5A, is radiating heat energy toward thin plate 250.

In one aspect, tube 252 may be a conventional, single-walled tube or conduit adapted to contain a working fluid, i.e., a fluid used as a medium for the transfer of energy from one part of a system to another, which is circulated therethrough. In the configuration described in conjunction with FIG. 5A, the working fluid is a cooling fluid. The cooling fluid may be process cooling water, chilled water, or other coolant, however the cooling fluid is preferably a liquid due to the higher heat content thereof compared to the heat content of gases. In one aspect, the cooling fluid is process cooling water, which is one variety of temperature-controlled water often used to cool critical components in substrate processing equipment, such as the water-cooled lids 220A-C, described above in conjunction with FIG. 4B. Process cooling water is typically recirculated between components being cooled and a cooling source, such as a cooling tower, and is typically controlled to a temperature no lower than about 27-30° C. In another aspect, chilled water may be used as the cooling fluid, when practicable. Chilled water is another type of temperature-controlled water, but differs from process cooling water in that it is cooled to a substantially lower temperature via refrigeration equipment, e.g., to about 5° C.-10° C., and may contain a freeze protectant, such as ethylene glycol. The lower temperature of chilled water in tube 252 allows a more rapid reduction in temperature of thin plate 250 than when process cooling water is used.

When tube 252 is configured as a conventional, single-walled tube, it is preferred that during the process of heating a substrate no cooling fluid is present in tube 252 to minimize the time required to heat thin plate 250 to the desired temperature. Because thin plate 250 is adapted to have very little mass and to be highly conductive of heat energy, the relatively large mass and low temperature of the cooling fluid in tube 252 would otherwise significantly increase the time required to heat thin plate 250. Therefore, the cooling fluid is removed prior to or at the beginning of the substrate degassing process, for example by a high-pressure gas purge.

When configured for a load lock adapted to process large-area substrates, tube 252 is necessarily of significant length, for example, ten's of meters for a 2 m×2 m load lock, and contains a large number of elbows. Because of this, the removal of a cooling fluid therefrom may be prohibitively time-consuming, even with a high-pressure gas purge. Further, the substrate cooling process is also delayed due to the additional time necessary to refill tube 252 with cooling fluid. For this reason, tube 252 is preferably configured as a double-walled conduit, wherein the inner wall forms an inner conduit containing the cooling fluid and wherein the inner conduit and outer conduit are configured to have little or no contact with each other.

Figure 5B:
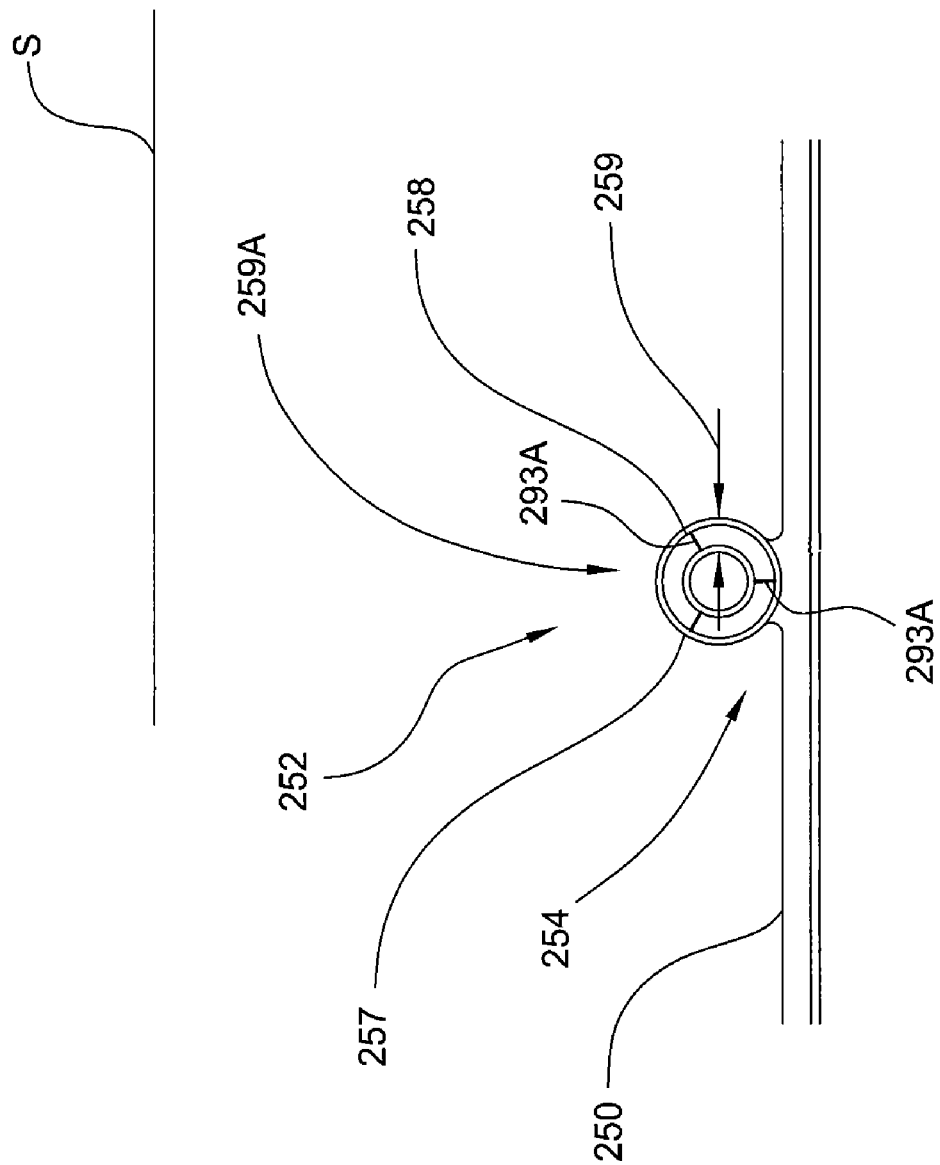
FIG. 5B is a partial cross-sectional view of thin plate and a cooling tube.

FIG. 5B is a partial cross-sectional view of thin plate 250 and tube 252. Tube 252 includes an inner tube 258, an outer tube 257, and an isolation region 259 separating inner tube 258 and outer tube 257. Tube 252 is mounted to thin plate 250 by a brazed joint 254 for optimal thermal coupling therebetween. Inner tube 258 may be suspended and/or separated from outer tube 257 by wire suspension 293A in order to minimize the thermal coupling therebetween. In a preferred configuration, outer tube 257 is an aluminum tube with an outer diameter of about ¾ inches and inner tube 258 is an aluminum tube with an outer diameter of about ½ inches.

Figure 5C:
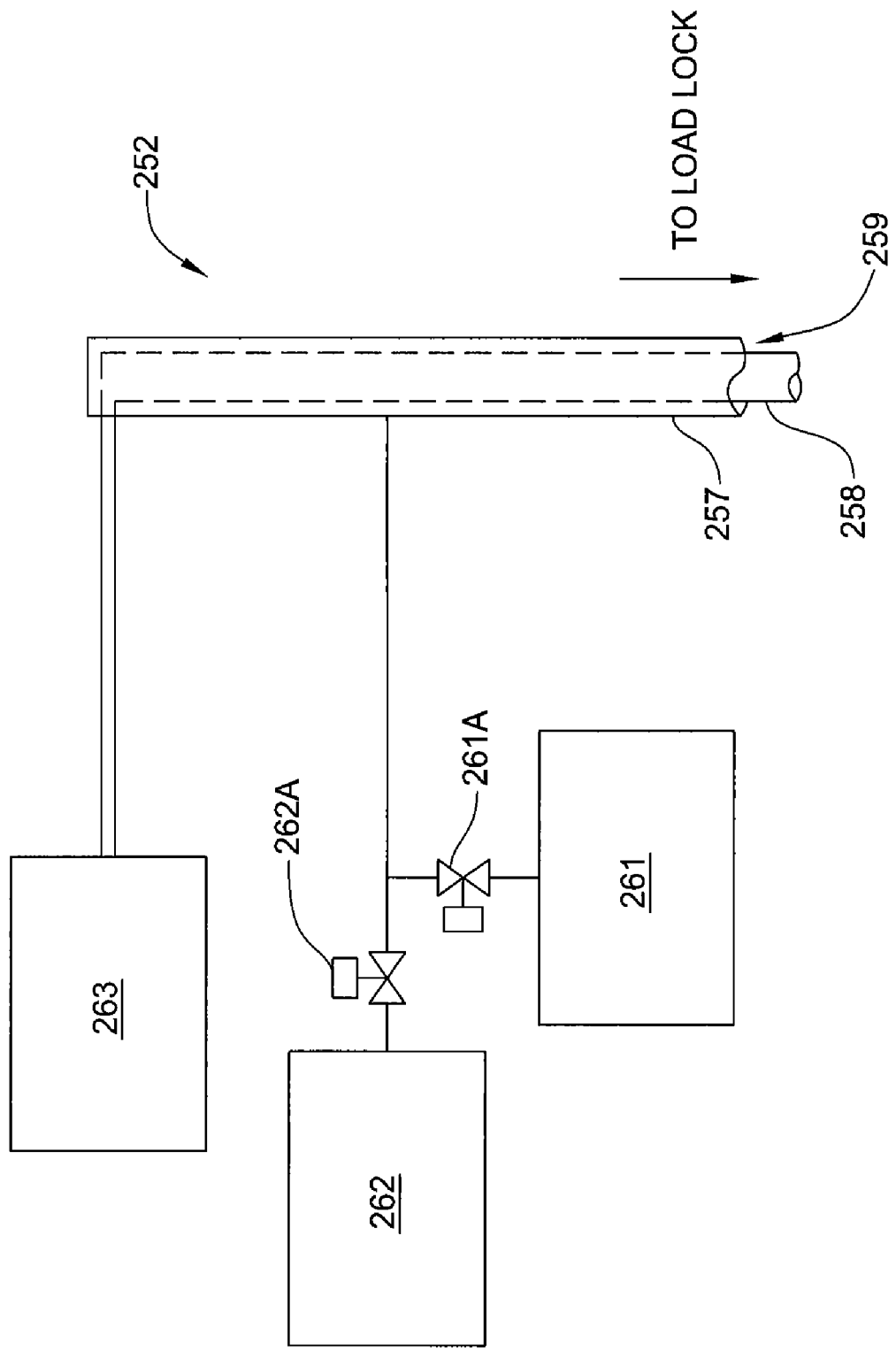
FIG. 5C is a schematic diagram of plumbing connections to a cooling tube.

Referring to FIG. 5C, which is a schematic diagram of plumbing connections to tube 252, isolation region 259 is adapted to be fluidly coupled to a vacuum source 261 and to a gas source 262. Inner tube 258 is fluidly coupled to a water source 263. Water source 263 may be a chilled water source or a process cooling water source. In a preferred configuration, vacuum source 261 is fluidly coupled and decoupled to isolation region 259 by an automatically controlled valve 261A and gas source 262 is fluidly coupled and decoupled to isolation region 259 by an automatically controlled valve 262A. In another configuration, a three-way valve (not shown) is used in lieu of automatically controlled valves 261A, 262A to alternately connect either vacuum source 261 or gas source 262 to isolation region 259. Vacuum source 261 may be any vacuum source that is adapted to provide rough vacuum, i.e., about $10^{-3}$ Torr or higher, for example a roughing pump configured for the load lock. Gas source 262 may be any source of pressurized gas including house nitrogen, compressed air, etc. Preferably, gas source 262 supplies a highly heat conductive gas to isolation region 259, such as helium.

In the double-walled configuration of tube 252, thin plate 250 may be quickly and advantageously converted from a heating plate to a cooling plate without using any mechanical devices in the chamber and also without the delay associated with purging cooling fluid from tube 252. To wit, for the substrate degassing process, isolation region 259 is fluidly coupled to vacuum source 261, removing essentially all heat-conducting gas contained in isolation region 259 and thermally isolating inner tube 258 and the cooling fluid contained therein from outer tube 257 and thin plate 250. The time required to remove the heat-conducting gas from isolation region 259 via a vacuum source is on the order of a few seconds, which is believed to be at least an order of magnitude shorter than the time required for a cooling fluid purge from tube 252. Further, removal of the heat-conducting gas can be completed within the substrate exchange time, i.e., the time required for one substrate to be removed from a load lock and another substrate therein. This allows the load lock to convert from heating mode to cooling mode without adding any time to the degassing or cooling processes. For the substrate cooling process, isolation region 259 is fluidly coupled to gas source 262, providing conductive and convective heat transfer between inner tube 258 and outer tube 257. Filling isolation region 259 with conductive gas from gas source 262 also takes place in a few seconds; there is no delay in the cooling process while tube 252 is re-charged with cooling fluid.

A further advantage of the double-walled configuration of tube 252, described above in conjunction with FIG. 5B, is that heating plate 521 may remain at a constant temperature regardless of whether substrate heating or cooling is taking place in load lock 590. It is known in the art that a primary cause of failure of high-temperature resistive heating elements is due to thermal cycling of the heating element as well as the electrical connections thereto. By allowing heating plate 521 to remain at a relatively constant temperature, the use of thin plate 250 and the double-walled configuration of tube 252 substantially extends the lifetime and reliability of heating plate 521.

In operation, thin plate 250 may therefore act as either an intermediary heating plate between heating plate 521 and substrate S or as a heat shield/cooling plate between heating plate 521 and a substrate S. FIG. 6 is a flow chart summarizing a process sequence 600 for degassing a substrate in a load lock, such as load lock 590 in FIG. 5A.

Referring to FIGS. 5A, 5C, and 6, in step 601 of processing sequence 600, cooling of thin plate 250 is stopped. For aspects in which tube 252 is configured as a single-walled tube, coolant flow through tube 252 is stopped and the cooling fluid therein is removed. For aspects in which tube 252 is configured as a double-walled tube, as described above in conjunction with FIG. 5B, isolation region 259 (see FIG. 5C) is fluidly coupled to vacuum source 261. Cooling fluid is not removed from inner tube 258 because it is thermally isolated from thin plate 250 by the vacuum present in isolation region 259. In either case, radiant heat 550 from heating plate 521 begins heating thin plate 250. Heating plate 521 may be set to maintain a temperature of 250° C. or more—rather than the more conventional 200° C.—in order to compensate for the slightly reduced heating efficiency resulting from the presence of thin plate 250 between heating plate 521 and substrate S.

In step 602, a substrate S is transferred from atmospheric conditions into load lock 590 and is positioned therein proximate and parallel to thin plate 250 and heating plate 521.

In step 603, load lock 590 is isolated from atmosphere by a vacuum-tight closure, such as a slit valve or gate valve (not shown), and pump-down of load lock 590 begins. To prevent condensation from forming in load lock 590 during pump-down, which may contaminate substrate S, the rate of depressurization of load lock 590 may be slowed by a throttle or other control valve, extending the time required to reach ultimate vacuum from a few seconds to several minutes. During this time, radiant heat 551 from thin plate 250 is also heating substrate S.

In step 604, substrate S is heated to the desired temperature while under vacuum to encourage the desorption of water molecules and other contaminants adsorbed on the surface of substrate S. The target temperature of substrate S is typically about 100° C.

In step 605, substrate S is removed from load lock 590 and transferred to a PVD or other vacuum processing chamber.

Figure 7:
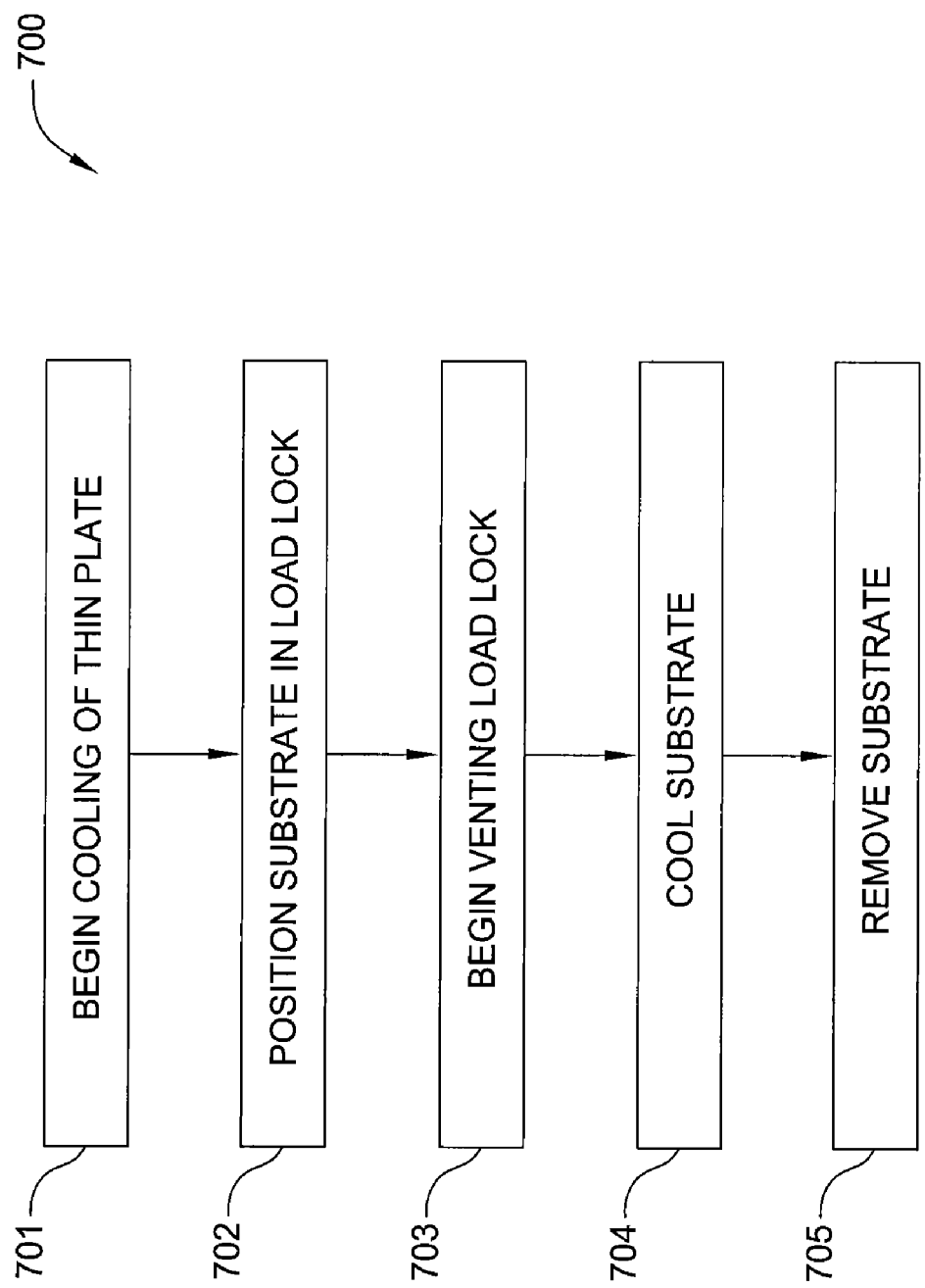
FIG. 7 is a flow chart summarizing a process sequence for cooling a substrate in a load lock after processing.

FIG. 7 is a flow chart summarizing a process sequence 700 for cooling a substrate in load lock 590 after PVD or other processing and prior to removal from a substrate processing system. Referring to FIGS. 5A, 5C and 7, in step 701 of processing sequence 700, cooling of thin plate 250 begins. For aspects in which tube 252 is configured as a single-walled tube, coolant flow through tube 252 is resumed. For aspects in which tube 252 is configured as a double-walled tube, as described above in conjunction with FIG. 5B, isolation region 259 (see FIG. 5C) is fluidly coupled to gas source 262 and isolation region 259 is pressurized with a heat-conducting gas, preferably helium. In either case, the cooling fluid in tube 252 cools thin plate 250. Because thin plate 250 acts as a radiant heat shield between heating plate 521 and substrate S, heating plate 521 is not turned off and allowed to cool.

In step 702, a substrate S is transferred from an adjacent vacuum chamber, such as a transfer chamber, and into load lock 590. Substrate S is positioned in load lock 590 proximate and parallel to thin plate 250 and heating plate 521.

In step 703, load lock 590 is isolated from the adjacent vacuum chamber by a vacuum-tight closure, such as a slit valve or gate valve (not shown), and load lock 590 is slowly pressurized back to atmospheric pressure. Because high venting rates contribute to particulate contamination of substrates, up to 60 seconds are required to fully vent load lock 590 to atmospheric pressure. During this time, substrate S is cooled by radiant heat transfer to the water-cooled lid (not shown) of load lock 590 and to thin plate 250.

In step 704, substrate S is cooled to the desired temperature while load lock 590 is being pressurized. In one aspect, a venting gas is directed across substrate S, providing additional convective cooling of substrate S.

In step 705, substrate S is removed from load lock 590 and transferred to a PVD or other vacuum processing chamber.

While the inventive apparatus may be used for a load lock as described herein, the use of a thin plate that may alternately act as a heating plate or a cooling plate may also be beneficially incorporated into other vacuum chambers to heat and cool a substrate. For example, in some situations it may be preferable to degas and cool-down substrates in a central transfer chamber, such as chamber 202, illustrated above in FIG. 3.

Another aspect of the inventive apparatus, namely the use of a double-walled conduit containing an isolation region to thermally couple and decouple an inner conduit and an outer conduit, may be used for other applications as well. For example, the working fluid disposed in the inner conduit need not be limited to a cooling fluid and may instead be a heating fluid. Further, the double-walled conduit may be thermally coupled to other heat transfer besides a thin plate disposed between a heating plate and a substrate. For example, the double-walled conduit may be thermally coupled to an array of heating vanes, such as those commonly contained in heat exchangers.

Although several preferred embodiments which incorporate the teachings of the present invention have been shown and described in detail, those skilled in the art can readily devise many other varied embodiments that still incorporate these teachings.

While the foregoing is directed to embodiments of the present invention, other and further embodiments of the invention may be devised without departing from the basic scope thereof, and the scope thereof is determined by the claims that follow.

What is claimed is:

1. An apparatus for thermally coupling and decoupling a working fluid from a heat transfer surface, comprising:
    a first conduit thermally coupled to the heat transfer surface;
    a second conduit disposed inside the first conduit, wherein an isolation region is disposed between the first conduit and the second conduit, the second conduit having substantially no contact with the first conduit and containing a working fluid;
    a vacuum source adapted to be selectively coupled to the isolation region; and
    a gas source adapted to be selectively coupled to the isolation region, wherein the working fluid is thermally decoupled from the first conduit by fluidly coupling the vacuum source to the isolation region and wherein the working fluid is thermally coupled to the first conduit by fluidly coupling the gas source to the isolation region.

2. The apparatus of claim 1, wherein the first conduit comprises an outer circular tube and the second conduit comprises an inner circular tube that is disposed inside the outer circular tube.

3. The apparatus of claim 2, wherein the total length of each of the outer circular tube and the inner circular tube is greater than 10 meters.

4. The apparatus of claim 1, wherein the gas source is a helium gas source.

5. The apparatus of claim 1, wherein the vacuum source is decoupled from the isolation region when the gas source is coupled to the isolation region, and the gas source is decoupled from the isolation region when the vacuum source is coupled to the isolation region.

6. An apparatus for heating and cooling a substrate in a vacuum chamber, comprising:
    a heating plate;
    a heat transfer plate disposed proximate and substantially parallel to the heating plate;
    a tube thermally coupled to the heat transfer plate, wherein the outer diameter of the tube is greater than the thickness of the heat transfer plate; and
    a substrate support adapted to support a substrate proximate and substantially parallel to the heat transfer plate so that the heat transfer plate is disposed between the heating plate and the substrate.

7. The apparatus of claim 6, wherein the tube contains a working fluid for cooling the heat transfer plate.

8. The apparatus of claim 6, wherein the tube has:
    a first conduit; and
    a second conduit disposed inside the first conduit, wherein an isolation region is disposed between the first conduit and the second conduit, the second conduit having substantially no contact with the first conduit and containing a working fluid,
    wherein the working fluid is thermally decoupled from the first conduit by fluidly coupling a vacuum source to the isolation region and the working fluid is thermally coupled to the first conduit by fluidly coupling a gas source to the isolation region.

9. The apparatus of claim 8, wherein the substrate support comprises a plurality of lift fingers for supporting large-area glass substrates.

10. The apparatus of claim 9, wherein the gas source is a helium gas source.

11. The apparatus of claim 6, wherein the heat transfer plate is an aluminum plate and is between about 0.010 inches and about 0.040 inches thick.

12. A vacuum load lock adapted to heat and cool a substrate, comprising:
    a heating plate;
    a heat transfer plate disposed proximate and substantially parallel to the heating plate;
    a tube thermally coupled to the heat transfer plate and having:
    a first conduit;
    a second conduit disposed inside the first conduit, wherein an isolation region is disposed between the first conduit and the second conduit, the second conduit having substantially no contact with the first conduit and containing a working fluid; and
    a substrate support adapted to support a substrate proximate and substantially parallel to the heat transfer plate so that the heat transfer plate is disposed between the heating plate and the substrate, wherein the working fluid is thermally decoupled from the first conduit by fluidly coupling a vacuum source to the isolation region and wherein the working fluid is thermally coupled to the first conduit by fluidly coupling a gas source to the isolation region.

13. The apparatus of claim 12, wherein the substrate support comprises a plurality of lift fingers for supporting large-area glass substrates.

14. The apparatus of claim 12, wherein the gas source is a helium gas source.

15. The apparatus of claim 12, wherein the heat transfer plate is an aluminum plate and is between about 0.010 inches and about 0.040 inches thick.

16. A method for cooling a substrate that is supported on a substrate support, wherein the substrate support is disposed above a heating plate and a heat transfer plate that is positioned between the substrate support and the heating plate, the method comprising:
    turning off heating elements of the heating plate; and
    flowing a cooling fluid through a tube that is thermally coupled to the heat transfer plate, wherein the outer diameter of the tube is greater than the thickness of the heat transfer plate.

17. The method of claim 16, wherein the tube comprises a first conduit and a second conduit disposed inside the first conduit and having substantially no contact with the first conduit, and wherein the cooling fluid is flowed through the second conduit.

18. The method of claim 17, further comprising flowing a gas through the first conduit to thermally couple the cooling fluid with the heat transfer plate.

19. The method of claim 18, wherein the gas comprises helium gas.

20. The method of claim 16, wherein the total length of the tube is greater than 10 meters.

* * * * *